United States Patent
Knoblinger et al.

(10) Patent No.: US 8,877,576 B2
(45) Date of Patent: Nov. 4, 2014

(54) INTEGRATED CIRCUIT INCLUDING A FIRST CHANNEL AND A SECOND CHANNEL

(75) Inventors: Gerhard Knoblinger, Villach (AT); Franz Kuttner, St. Ulrich (AT)

(73) Assignee: Infineon Technologies AG, Neubiberg (DE)

( * ) Notice: Subject to any disclaimer, the term of this patent is extended or adjusted under 35 U.S.C. 154(b) by 1597 days.

(21) Appl. No.: 11/843,883

(22) Filed: Aug. 23, 2007

(65) Prior Publication Data

US 2009/0050973 A1 Feb. 26, 2009

(51) Int. Cl.
- *H01L 21/336* (2006.01)
- *H01L 29/78* (2006.01)
- *H01L 27/092* (2006.01)
- *H01L 21/8238* (2006.01)

(52) U.S. Cl.
CPC .... *H01L 21/823807* (2013.01); *H01L 29/7843* (2013.01); *H01L 27/092* (2013.01)
USPC ......................................................... 438/197

(58) Field of Classification Search
None
See application file for complete search history.

(56) References Cited

U.S. PATENT DOCUMENTS

| | | | |
|---|---|---|---|
| 6,974,981 B2 | 12/2005 | Chidambarrao et al. | |
| 7,022,561 B2 * | 4/2006 | Huang et al. | 438/197 |
| 7,101,765 B2 | 9/2006 | Curello et al. | |
| 7,109,516 B2 | 9/2006 | Langdo et al. | |
| 7,198,995 B2 | 4/2007 | Chidambarrao et al. | |
| 7,202,513 B1 | 4/2007 | Chidambarrao et al. | |
| 7,205,206 B2 * | 4/2007 | Belyansky et al. | 438/424 |
| 2002/0070789 A1 * | 6/2002 | Dathe et al. | 327/356 |
| 2004/0212016 A1 * | 10/2004 | Yasui et al. | 257/365 |
| 2007/0026599 A1 | 2/2007 | Peidous et al. | |
| 2007/0190708 A1 | 8/2007 | Kaneko et al. | |
| 2007/0190741 A1 | 8/2007 | Lindsay | |

OTHER PUBLICATIONS

HPCWire. AMD and IBM Collaborate on 45nm Process Technology, Dec. 15, 2006.*

Victor Moroz, Xiaopeng Xu, Dipu Primanki, Faran Nouri, Zoran Krivokapic, "Analyzing strained-silicon options for Stress-Engineering transistors" Jul. 2004, Software p. 49+.*

* cited by examiner

*Primary Examiner* — Vongsavanh Sengdara
(74) *Attorney, Agent, or Firm* — Dicke, Billig & Czaja, PLLC (57) ABSTRACT

An integrated circuit is disclosed. In one embodiment, the integrated circuit includes a first area and a second area. The first area is stress engineered to provide enhanced mobility in a first channel that has a first width. The second area is stress engineered to provide enhanced mobility in a second channel that has a second width. The first channel and the second channel provide a combined current that is greater than a single current provided via a single channel having a single width that is substantially equal to the sum of the first width and the second width.

7 Claims, 5 Drawing Sheets

INTEGRATED CIRCUIT INCLUDING A FIRST CHANNEL AND A SECOND CHANNEL

BACKGROUND

Typically, an electronic system includes a number of integrated circuit chips that process data and communicate with one another to perform system applications. The integrated circuit chips include devices, such as n-channel metal oxide semiconductor (NMOS) transistors and p-channel metal oxide semiconductor (PMOS) transistors. Often, the integrated circuit chips include NMOS and PMOS transistors in a complementary metal oxide semiconductor (CMOS) configuration. Semiconductor manufacturers continue increasing device densities and speeds to meet the demands of system applications.

Semiconductor manufacturers use stress engineering to enhance device performance. Stresses are introduced into the channel of a device to enhance hole or electron mobility and thereby conductivity through the channel. The stresses affect bandgap and carrier mobility in the silicon and applying the appropriate stress to a channel can significantly improve device performance in terms of the Ion/Ioff ratio. Stress engineering techniques have been used in deep sub-micron process technologies, such as 90 nm processes and 65 nm processes.

PMOS and NMOS devices respond differently to different types of stress. PMOS device performance is enhanced by applying compressive stress to a channel and NMOS device performance is enhanced by applying tensile stress to the channel. Also, stresses can be induced locally, which allows PMOS and NMOS devices to be enhanced independently.

Typically, PMOS and NMOS devices are scaled by increasing the width of the channels. However, stress engineering introduces a width dependence on device performance, such that the maximum on current per width decreases due to stress effects as width is increased.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
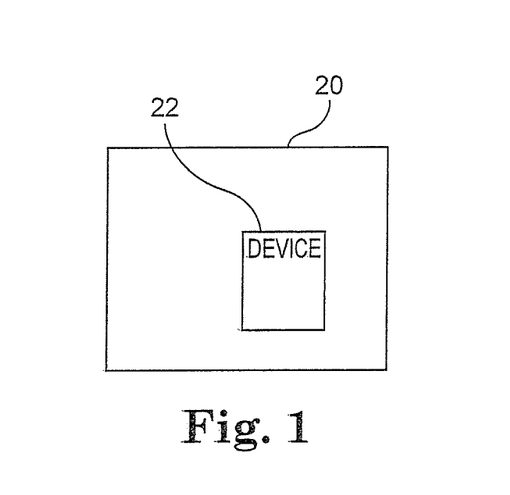
FIG. 1 is a diagram illustrating one embodiment of an integrated circuit according to the present invention.

FIG. 1 is a diagram illustrating one embodiment of an integrated circuit 20 according to the present invention. Integrated circuit 20 is manufactured via a deep sub-micron process technology. In one embodiment, integrated circuit 20 is manufactured via a 45 nanometer (nm) process technology. In one embodiment, integrated circuit 20 is manufactured via less than or equal to a 45 mm process technology, i.e., at most a 45 nm process.

Integrated circuit 20 includes device 22, which can be any suitable device. In one embodiment, device 22 is a CMOS device. In one embodiment, device 22 is an NMOS transistor. In one embodiment, device 22 is a PMOS transistor.

Device 22 includes multiple active areas, where each active area includes a channel that provides a corresponding current and has a corresponding width. The corresponding currents are summed to provide a combined current that is greater than a single current provided via a single channel having a single width that is substantially equal to the sum of the corresponding widths. The combined or total current is directly proportional to the sum of the corresponding widths. In one embodiment, the active areas are separated via one or more shallow trench isolation regions.

In one embodiment, each of the active areas is stress engineered to enhance mobility in the channel. Smaller channel widths benefit more from stress engineering than larger channel widths. The performance of a single channel having a larger channel width is degraded due to stress effects. The difference in performance between smaller channels and larger channels due to stress effects is more apparent and becomes an issue in process technologies of less than or equal to the 45 nm technology node.

In one embodiment, device 22 is an NMOS device and the multiple active areas are stress engineered to provide enhanced mobility in the channels via tensile stress along the channels. In one embodiment, device 22 is a PMOS device and the multiple channels are stress engineered to provide enhanced mobility in the channels via compressive stress along the channels.

In one embodiment, each of the active areas is substantially similar to each of the other active areas and the corresponding channel widths are substantially equal to one another. Also, the corresponding currents are substantially equal to one another, such that the combined current is an integer multiple of one of the corresponding currents. In one embodiment, each active area and channel is the size of a 1× device.

In one embodiment, device 22 includes a first active area and a second active area. The first active area includes a first channel that has a first width and the second active area includes a second channel that has a second width. The first channel provides a first current and the second channel provides a second current. The first and second currents are summed to provide a combined current that is greater than a single current provided via a single channel having a single width substantially equal to the sum of the first width and the second width.

In one embodiment, a first active area is stress engineered to enhance carrier mobility in a first channel and a second active area is stress engineered to enhance carrier mobility in a second channel. The smaller channel widths of the first channel and the second channel benefit more from stress engineering than the larger channel width of a single channel, such that the performance of the single channel is degraded due to stress effects and the combined current is greater than a single current from the single channel. Also, the combined current is directly proportional to the sum of the first width and the second width.

In one embodiment, the first active area is substantially similar to the second active area and the first width is substantially equal to the second width. Also, the first current is substantially equal to the second current, such that the combined current is twice the first current. If the first active area and the second active area are each the size of a 1× device, a device that includes only the first active area and the second active area is a 2× device. Also, a device that includes n active areas that are each the size of a 1× device, is scaled to be an n× device.

Figure 2:
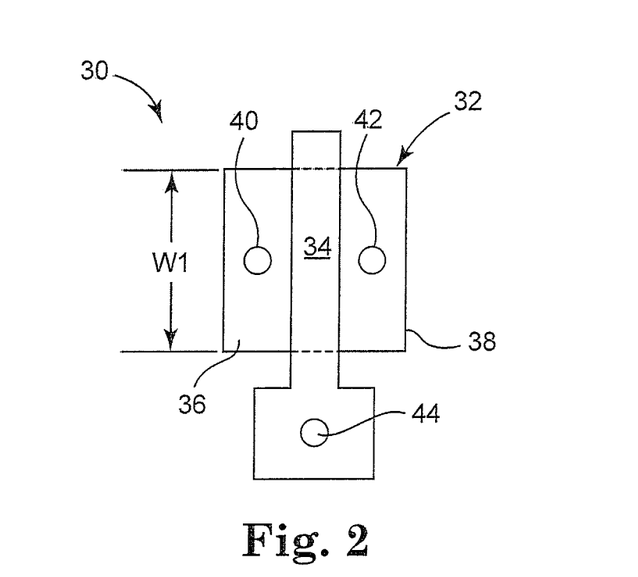
FIG. 2 is a diagram illustrating one embodiment of a metal oxide semiconductor field effect transistor (MOSFET).

FIG. 2 is a diagram illustrating one embodiment of a metal oxide semiconductor field effect transistor (MOSFET) 30 having a channel width of W1. In one embodiment, MOSFET 30 is manufactured via a 45 nm process. In one embodiment, MOSFET 30 is manufactured via at most a 45 nm process. In one embodiment, MOSFET 30 is an NMOS transistor. In one embodiment MOSFET 30 is a PMOS transistor.

MOSFET 30 includes an active area 32 and a gate 34. Active area 32 is a 3-dimensional volume that includes a portion of gate 34, drain/source region 36 on one side of gate 34, source/drain region 38 on the other side of gate 34, and a channel under gate 34 and between drain/source region 36 and source/drain region 38. Active area 32 and the channel have a width of W1. In one embodiment, MOSFET 30 including width W1 is sized to be a 1× device of the manufacturing process.

Drain/source region 36 includes drain/source contact 40 and source/drain region 38 includes source/drain contact 42. Gate 34 extends to include gate contact 44. In one embodiment, gate 34 includes a poly-silicon gate structure.

In one embodiment, active area 32 is stress engineered to enhance mobility in the channel. Channels having smaller channel widths benefit more from stress engineering than channels having larger channel widths. The performance of a channel having a larger channel width is degraded due to stress effects. The differences in channel performance due to stress effects in channels having smaller channel widths versus channels having larger channel widths is more apparent and becomes an issue in process technologies of less than or equal to the 45 nm technology node.

In one embodiment, MOSFET 30 is an NMOS device and active area 32 is stress engineered to provide enhanced mobility in the channel via tensile stress along the channel. In one embodiment, MOSFET 30 is a PMOS device and active area 32 is stress engineered to provide enhanced mobility in the channel via compressive stress along the channel. In one embodiment, drain/source region 36 and source/drain region 38 are silicon-germanium regions. In one embodiment, active area 32 includes a strain-inducing capping layer.

In operation, an active gate voltage is applied to gate 34 via contact 44 and MOSFET 30 conducts current between drain/source region 36 and source/drain region 38. The current can be provided to other circuits via drain/source contact 40 and source/drain contact 42. The magnitude of the current corresponds to channel width W1, where larger channel widths correspond to larger currents and smaller channel widths correspond to smaller currents. If active area 32 is stress engineered, the magnitude of the current is larger for a given channel width W1.

Figure 3:
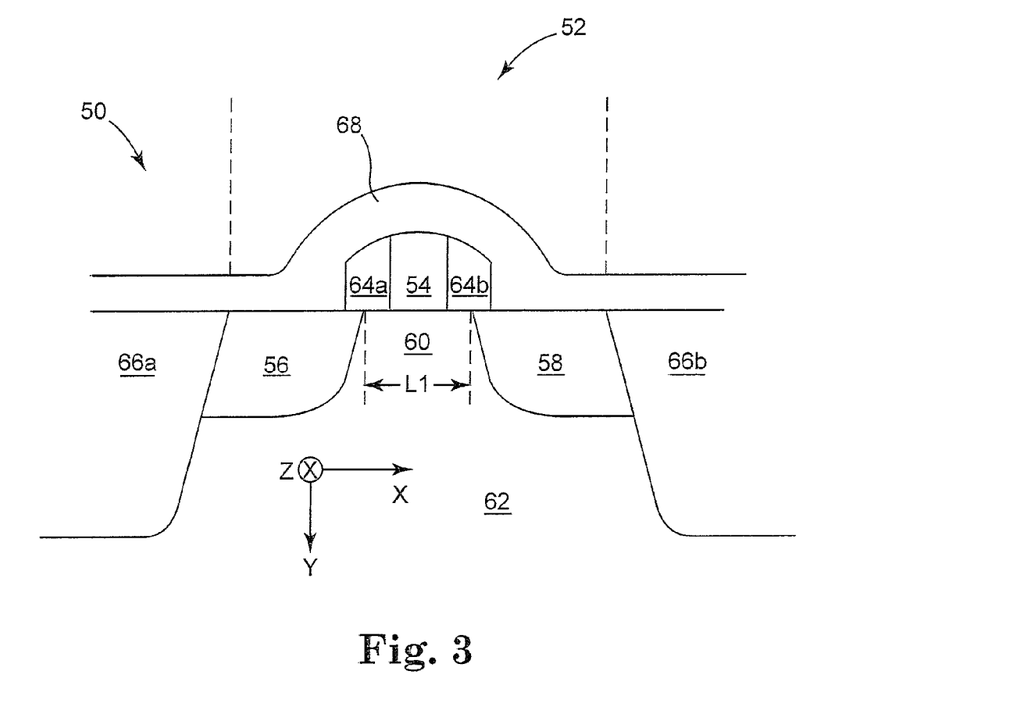
FIG. 3 is a cross-section diagram illustrating one embodiment of a MOSFET.

FIG. 3 is a cross-section diagram illustrating one embodiment of a MOSFET 50. MOSFET 50 includes active area 52, indicated between the dashed lines, where active area 52 is a 3-dimensional volume that extends in the x, y, and z dimensions. MOSFET 50 is similar to MOSFET 30 of FIG. 2. In one embodiment, MOSFET 50 is an NMOS transistor. In one embodiment MOSFET 50 is a PMOS transistor.

MOSFET 50 is manufactured via a deep sub-micron process technology. In one embodiment, MOSFET 50 is manufactured via a 45 nm process. In one embodiment, MOSFET 50 is manufactured via at most a 45 nm process.

Active area 52 includes gate 54, drain/source region 56, source/drain region 58, and a channel 60 in substrate 62. Channel 60 is under gate 54 and between drain/source region 56 and source/drain region 58. Channel 60 has channel length L1 that extends in the x direction along channel 60 and between drain/source region 56 and source/drain region 58. Also, channel 60 has a channel width in the z direction, which is similar to channel width W1 of MOSFET 30. In addition, channel 60 extends vertically in the y direction from gate 54. In one embodiment, MOSFET 50, including channel length L1 and the channel width, is sized to be a 1× device of the manufacturing process.

Active area 52 includes spacer 64a, spacer 64b, and strain-inducing capping layer 68. Active area 52 is bounded by shallow trench isolation regions 66a and 66b that isolate active area 52 from other devices. Spacer 64a is on one side of gate 54 and spacer 64b is on the other side of gate 54. Shallow trench isolation region 66a is on one side of active area 52 and shallow trench isolation region 66b is on the other side of active area 52. Capping layer 68 is applied over shallow trench isolation regions 66a and 66b, gate 54, spacers 64a and 64b, drain/source region 56, and source/drain region 58. Standard lithography patterning techniques can be used to selectively deposit capping layer 68.

Active area 52 is stress engineered to enhance mobility in channel 60. In one embodiment, MOSFET 50 is an NMOS transistor and active area 52 is stress engineered to provide enhanced mobility in channel 60 via tensile stress along channel length L1 of channel 60. In one embodiment, MOSFET 50 is a PMOS transistor and active area 52 is stress engineered to provide enhanced mobility in channel 60 via compressive stress along channel length L1 of channel 60.

In one embodiment, drain/source region 56 and source/drain region 58 are silicon-germanium regions that provide compressive stress along channel length L1 of channel 60. In one embodiment, capping layer 68 is applied to provide compressive stress along channel length L1 of channel 60. In one embodiment, capping layer 68 is applied to provide tensile stress along channel length L1 of channel 60. In one embodiment, standard patterning and lithography techniques are used to selectively deposit a tensile capping layer over NMOS devices and a compressive capping layer over PMOS devices.

In operation, an active gate voltage is applied to gate 54 and MOSFET 50 conducts current along channel length L1, through channel 60 in the x direction between drain/source region 56 and source/drain region 58. The magnitude of the conducted current corresponds to the channel width of channel 60 in the z direction, where larger channel widths correspond to larger currents and smaller channel widths correspond to smaller currents. The stress engineered active area 52 provides a larger current for a given channel width.

Figure 4:
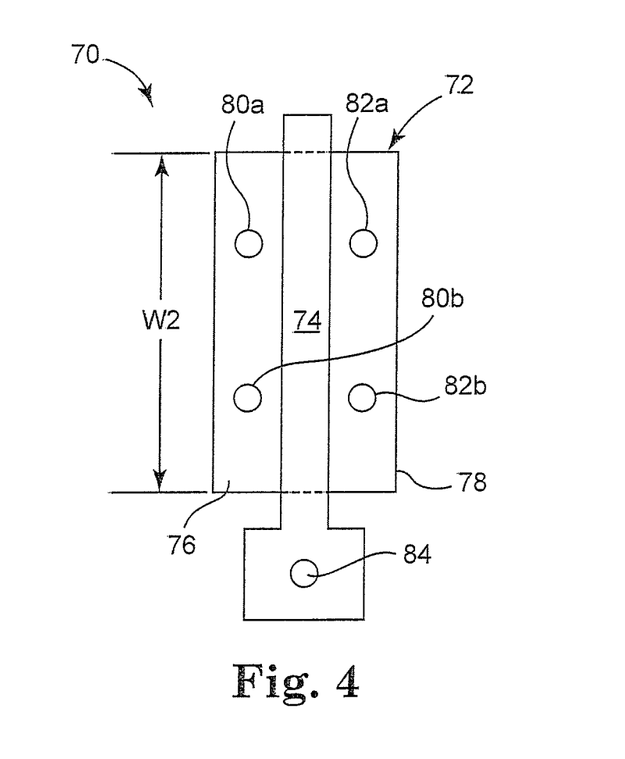
FIG. 4 is a diagram illustrating one embodiment of a MOSFET that is scaled to be a larger transistor than the MOSFET of FIG. 2.

FIG. 4 is a diagram illustrating one embodiment of a MOSFET 70 that is scaled to be a larger transistor than MOSFET 30. MOSFET 70 is similar to MOSFET 30 of FIG. 2, except the channel width W2 of MOSFET 70 is larger than the channel width W1 of MOSFET 30. In one embodiment, the channel width W2 is twice as large as the channel width W1.

MOSFET 70 includes active area 72 and gate 74. Active area 72 is a 3-dimensional volume that includes a portion of gate 74, drain/source region 76 on one side of gate 74, source/drain region 78 on the other side of gate 74, and a channel under gate 74 and between drain/source region 76 and source/drain region 78. Active area 72 and the channel have width W2.

Drain/source region 76 includes drain/source contacts 80a and 80b and source/drain region 78 includes source/drain contacts 82a and 82b. Gate 74 extends to include gate contact 84. In one embodiment, gate 74 includes a poly-silicon gate structure.

Active area 72 is stress engineered to enhance mobility in the channel. In one embodiment, MOSFET 70 is an NMOS device and active area 72 is stress engineered to provide enhanced mobility in the channel via tensile stress along the channel. In one embodiment, MOSFET 70 is a PMOS device and active area 72 is stress engineered to provide enhanced mobility in the channel via compressive stress along the channel. In one embodiment, drain/source region 76 and source/drain region 78 are silicon-germanium regions. In one embodiment, active area 72 includes a strain-inducing capping layer.

In operation, an active gate voltage is applied to gate 74 via contact 84 and MOSFET 70 conducts current between drain/source region 76 and source/drain region 78. The current can be provided to other circuits via drain/source contacts 80a and 80b and source/drain contacts 82a and 82b. The magnitude of the current corresponds to the channel width W2, where larger channel widths correspond to larger currents and smaller channel widths correspond to smaller currents.

Channels having smaller channel widths benefit more from stress engineering than channels having larger channel widths. The performance of a channel having a larger channel width is degraded due to stress effects. The difference in channel performance between channels having smaller channel widths and channels having larger channel widths is more apparent and becomes an issue in process technologies of less than or equal to the 45 nm technology node.

If MOSFET 30 and MOSFET 70 are stress engineered and manufactured in at most a 45 mm process, MOSFET 30 benefits more from the stress engineering than MOSFET 70, since channel width W1 is smaller than channel width W2. This results in MOSFET 30 providing more current per unit of channel width than MOSFET 70. The increase in current provided via MOSFET 70 is not directly proportional to the increase in channel width from channel width W1 to channel width W2. For example, if MOSFET 70 is scaled to have a 1-5 channel width W2 that is twice as large as channel width W1, MOSFET 70 does not provide a current that is twice as large as the current provided via MOSFET 30. Instead, MOSFET 70 provides a current that is less than twice the current provided via MOSFET 30.

Figure 5:
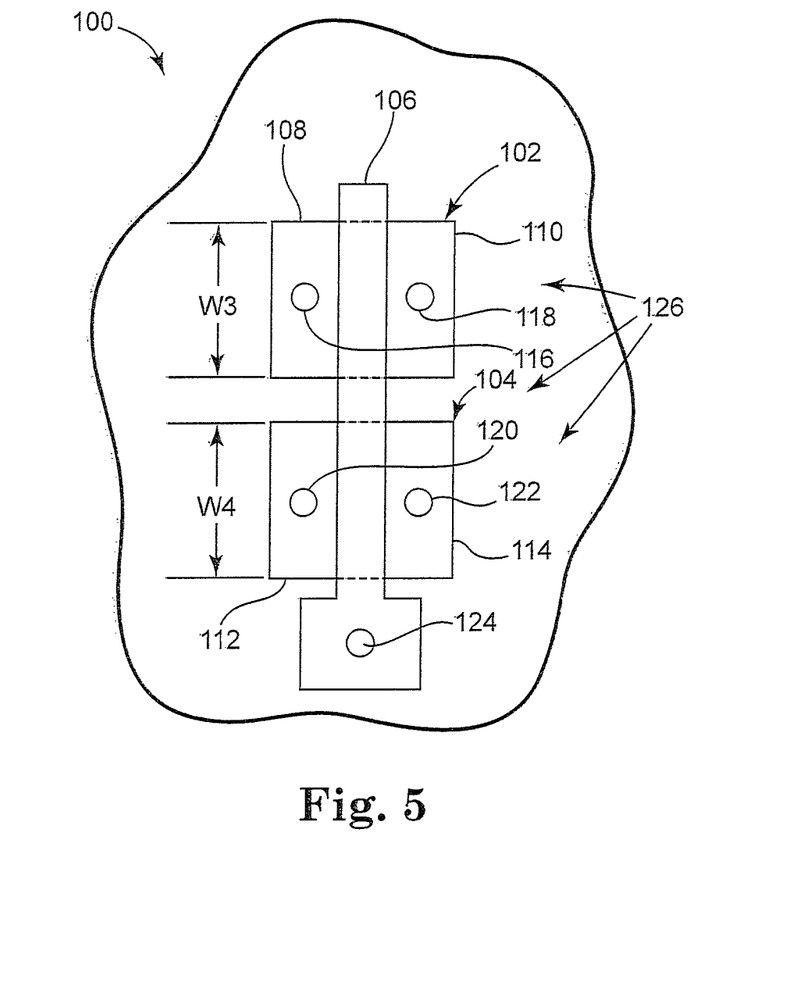
FIG. 5 is a diagram illustrating one embodiment of a MOSFET that includes a first active area and a second active area.

FIG. 5 is a diagram illustrating one embodiment of a MOSFET 100 that is scaled to be a larger transistor than MOSFET 30 of FIG. 2. MOSFET 100, includes a first active area 102, a second active area 104, and a gate 106. Each of the active areas 102 and 104 is similar to active area 32 (shown in FIG. 2) and similar to active area 52 (shown in FIG. 3).

First active area 102 includes a first channel having a channel width of W3 and second active area 104 includes a second channel having a channel width of W4. The combined current provided via the first and second channels in MOSFET 100 is directly proportional to the sum of channel width W3 and channel width W4. In one embodiment, at least one of the channel widths W3 and W4 is substantially equal to channel width W1 of MOSFET 30. In one embodiment, each of the channel widths of W3 and W4 is substantially equal to channel width W1 of MOSFET 30 and MOSFET 100 provides substantially twice as much current as MOSFET 30. In one embodiment, MOSFET 30 is a 1× device and each of the channel widths of W3 and W4 is substantially equal to channel width W1 of MOSFET 30, such that MOSFET 100 is a 2× device.

First active area 102 is a 3-dimensional volume that includes a portion of gate 106, drain/source region 108 on one side of gate 106, source/drain region 110 on the other side of gate 106, and the first channel under gate 106 and between drain/source region 108 and source/drain region 110. First active area 102 and the first channel have a width of W3. In one embodiment, channel width W3 is substantially equal to channel width W1. In other embodiments, channel width W3 can be any suitable width including widths that are larger or smaller than channel width W1 of MOSFET 30.

Second active area 104 is a 3-dimensional volume that includes a portion of gate 106, drain/source region 112 on one side of gate 106, source/drain region 114 on the other side of gate 106, and the second channel under gate 106 and between drain/source region 112 and source/drain region 114. Second active area 104 and the second channel have a width of W4. In one embodiment, channel width W4 is substantially equal to channel width W1. In other embodiments, channel width W4 can be any suitable width including widths that are larger or smaller than channel width W1 of MOSFET 30.

Drain/source region 108 includes drain/source contact 116 and source/drain region 110 includes source/drain contact 118. Drain/source region 112 includes drain/source contact 120 and source/drain region 114 includes source/drain contact 122. Gate 106 extends to include gate contact 124. Shallow trench isolation region 126 extends between and surrounds first active area 102 and second active area 104. Shallow trench isolation region 126 isolates first active area 102 from second active area 104. In one embodiment, gate 106 includes a poly-silicon gate structure.

First active area 102 is stress engineered to enhance mobility in the first channel and second active area 104 is stress engineered to enhance mobility in the second channel. In one embodiment, MOSFET 100 is an NMOS transistor and first active area 102 is stress engineered to provide enhanced mobility in the first channel via tensile stress along the first channel and second active area 104 is stress engineered to provide enhanced mobility in the second channel via tensile stress along the second channel. In one embodiment, MOSFET 100 is a PMOS transistor and first active area 102 is stress engineered to provide enhanced mobility in the first channel via compressive stress along the first channel and second active area 104 is stress engineered to provide enhanced mobility in the second channel via compressive stress along the second channel.

In one embodiment, drain/source regions 108 and 112 and source/drain regions 110 and 114 are silicon-germanium regions. In one embodiment, first active area 102 and second active area 104 include strain-inducing capping layers.

In operation, an active gate voltage is applied to gate 106 via contact 124. First active area 102 conducts current between drain/source region 108 and source/drain region 110 and provides a first current, and second active area 104 conducts current between drain/source region 112 and source/drain region 114 and provides a second current. The first current and the second current are combined to provide a total or combined current. The combined current is provided to other circuits via drain/source contacts 116 and 120 and source/drain contacts 118 and 122. The magnitude of the combined current corresponds to the sum of the channel widths W3 and W4.

In MOSFET 100, if active area 102 is substantially equal in size to active area 32 and active area 104 is substantially equal in size to active area 32 such that channel width W1 is substantially equal to channel width W3 and channel width W1 is substantially equal to channel width W4, MOSFET 100 provides substantially twice the current provided via MOSFET 30. This doubling of current via MOSFET 100 is directly proportional to the doubling of channel width from channel width W1 to the sum of channel widths W3 and W4. Since channel width W1 is substantially equal to channel width W3 and channel width W1 is substantially equal to channel width W4, each channel benefits equally from the stress engineering and one channels performance is not degraded more than any other channels performance. The current provided via MOSFET 100 is directly proportional to the sum of the channel widths W3 and W4.

Figure 6:
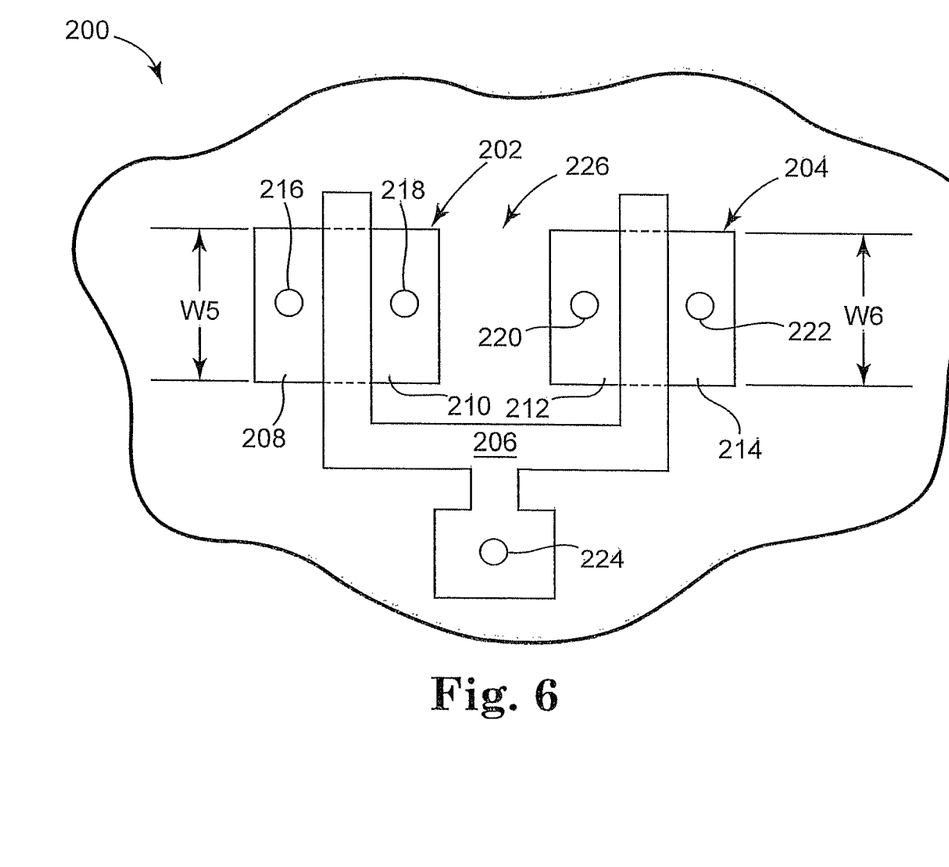
FIG. 6 is a diagram illustrating another embodiment of a MOSFET that includes a first active area and a second active area.

FIG. 6 is a diagram illustrating another embodiment of a MOSFET 200 that is scaled to be a larger transistor than MOSFET 30 of FIG. 2. MOSFET 200 includes a first active area 202, a second active area 204, and a gate 206. Each of the active areas 202 and 204 is similar to active area 32 (shown in FIG. 2) and similar to active area 52 (shown in FIG. 3).

First active area 202 includes a first channel having a channel width of W5 and second active area 204 includes a second channel having a channel width of W6. Gate 206 is forked to cross first active area 202 and second active area 204. The first channel is substantially equal to the second channel in the other dimensions of channel length and channel depth.

The combined current provided via the first and second channels in MOSFET 200 is directly proportional to the sum of channel width W5 and channel width W6. In one embodiment, at least one of the channel widths W5 and W6 is substantially equal to channel width W1 of MOSFET 30. In one embodiment, each of the channel widths W5 and W6 is substantially equal to channel width W1 of MOSFET 30 and MOSFET 200 provides substantially twice as much current as MOSFET 30. In one embodiment, MOSFET 30 is a 1x device and each of the channel widths of W5 and W6 is substantially equal to channel width W1 of MOSFET 30, such that MOSFET 200 is a 2x device.

First active area 202 is a 3-dimensional volume that includes a portion of gate 206, drain/source region 208 on one side of gate 206, source/drain region 210 on the other side of gate 206, and the first channel under gate 206 and between drain/source region 208 and source/drain region 210. First active area 202 and the first channel have a width of W5. In one embodiment, channel width W5 is substantially equal to channel width W1. In other embodiments, channel width W5 can be any suitable width including widths that are larger or smaller than channel width W1 of MOSFET 30.

Second active area 204 is a 3-dimensional volume that includes a portion of gate 206, drain/source region 212 on one side of gate 206, source/drain region 214 on the other side of gate 206, and the second channel under gate 206 and between drain/source region 212 and source/drain region 214. Second active area 204 and the second channel have a width of W6. In one embodiment, channel width W6 is substantially equal to channel width W1. In other embodiments, channel width W6 can be any suitable width including widths that are larger or smaller than channel width W1 of MOSFET 30.

Drain/source region 208 includes drain/source contact 216 and source/drain region 210 includes source/drain contact 218. Drain/source region 212 includes drain/source contact 220 and source/drain region 214 includes source/drain contact 222. Gate 206 extends to include gate contact 224. Shallow trench isolation region 226 extends between and surrounds first-active area 202 and second active area 204. Shallow trench isolation region 226 isolates first active area 202 from second active area 204. In one embodiment, gate 206 includes a poly-silicon gate structure.

First active area 202 is stress engineered to enhance mobility in the first channel and second active area 204 is stress engineered to enhance mobility in the second channel. In one embodiment, MOSFET 200 is an NMOS transistor and first active area 202 is stress engineered to provide enhanced mobility in the first channel via tensile stress along the first channel and second active area 204 is stress engineered to provide enhanced mobility in the second channel via tensile stress along the second channel. In one embodiment, MOSFET 200 is a PMOS transistor and first active area 202 is stress engineered to provide enhanced mobility in the first channel via compressive stress along the first channel and second active area 204 is stress engineered to provide enhanced mobility in the second channel via compressive stress along the second channel. In one embodiment, drain/source regions 208 and 212 and source/drain regions, 210 and 214 are silicon-germanium regions. In one embodiment, first active area 202 and second active area 204 include strain-inducing capping layers.

In operation, an active gate voltage is applied to gate 206 via contact 224. First active area 202 conducts current between drain/source region 208 and source/drain region 210 and provides a first current, and second active area 204 conducts current between drain/source region 212 and source/drain region 214 and provides a second current. The first current and the second current are combined to provide a total or combined current. The combined current is provided to other circuits via drain/source contacts 216 and 220 and source/drain contacts 218 and 222. The magnitude of the combined current corresponds to the sum of the channel widths W5 and W6.

In MOSFET 200, if active area 202 is substantially equal in size to active area 32 and active area 204 is substantially equal in size to active area 32 such that channel width W1 is substantially equal to channel width W5 and channel width W1 is substantially equal to channel width W6, MOSFET 200 provides substantially twice the current provided via MOSFET 30. This doubling of current via MOSFET 200 is directly proportional to the doubling of channel width from channel width W1 to the sum of channel widths W5 and W6. Since channel width W1 is substantially equal to channel width W5 and channel width W1 is substantially equal to channel width W6, each channel benefits equally from the stress engineering and one channels performance is not degraded more than any other channels performance. The current provided via MOSFET 200 is directly proportional to the sum of the channel widths W5 and W6.

Thus, in a MOSFET manufactured in at most a 45 nm process and stress engineered, the MOSFET can be scaled to provide an integer multiple of current by providing multiple active areas that are substantially equal in size to one active area, such as active area 32. For example, if MOSFET 30 is a 1× device, a MOSFET that includes two active areas that are each substantially equal in size to active area 32 is a 2× device and a MOSFET that includes three active areas that are each substantially equal in size to active area 32 is a 3× device, and so on.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is clamed is:

1. A method comprising:
enhancing mobility in a first channel that has a first width via stress engineering;
enhancing mobility in a second channel that has a second width via stress engineering; and
summing current from the first channel and the second channel to provide a summed current that is greater than a single current provided via a single channel that is stress engineered to enhance mobility and substantially the same as the first channel and the second channel, but having a single width equal to the sum of the first width and the second width, wherein:
enhancing mobility in a first channel comprises enhancing mobility more in the first channel than mobility is enhanced in the single channel; and
enhancing mobility in a second channel comprises enhancing mobility more in the second channel than mobility is enhanced in the single channel.

2. The method of claim 1, wherein enhancing mobility in a first channel comprises:
enhancing mobility in the first channel via tensile forces along the first channel in an re-channel metal oxide semiconductor device.

3. The method of claim 1, wherein enhancing mobility in a first channel comprises:
enhancing mobility in the first channel via compressive forces along the first channel in a p-channel metal oxide semiconductor device.

4. The method of claim 1, comprising:
providing a first current via the first channel; and
providing a second current via the second channel, such that the summed current is an integer multiple of the first current.

5. The method of claim 1, comprising:
providing a first area that includes the first channel;
providing a second area that includes the second channel; and
separating the first area from the second area via a shallow trench isolation region.

6. A method comprising:
forming a first channel having a first width via at most a 45 nanometer process;
forming a second channel having a second width via at most the 45 nanometer process;
enhancing mobility in the first channel via stress engineering;
enhancing mobility in the second channel via stress engineering; and
summing current from the first channel and the second channel to provide a summed current that is greater than a single current provided via a single channel that is stress engineered to enhance mobility and substantially similar to the first channel and the second channel, but having a single width equal to the sum of the first width and the second width, wherein:
enhancing mobility in the first channel comprises enhancing mobility more in the first channel than mobility is enhanced in the single channel; and
enhancing mobility in the second channel comprises enhancing mobility more in the second channel than mobility is enhanced in the single channel.

7. The method of claim 6, wherein the first width is equal to the second width and comprising:
conducting a first current via the first channel; and
conducting a second current via the second channel, such that the summed current is twice the first current and the sum of the first width and the second width is twice the first width.

* * * * *